(12) United States Patent
Jeong et al.

(10) Patent No.: US 7,663,962 B2
(45) Date of Patent: Feb. 16, 2010

(54) SEMICONDUCTOR MEMORY DEVICE

(75) Inventors: Chun-Seok Jeong, Kyoungki-do (KR); Kang-Seol Lee, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 11 days.

(21) Appl. No.: 11/824,014

(22) Filed: Jun. 29, 2007

(65) Prior Publication Data

US 2008/0080280 A1 Apr. 3, 2008

(30) Foreign Application Priority Data

Sep. 26, 2006 (KR) ........................ 10-2006-0096355

(51) Int. Cl.
*G11C 8/00* (2006.01)
(52) U.S. Cl. .................. 365/230.03; 365/203; 365/196; 365/205; 365/207; 365/189.17
(58) Field of Classification Search ............ 365/230.03, 365/203, 196, 205, 207, 189.17
See application file for complete search history.

(56) References Cited

U.S. PATENT DOCUMENTS

| | | | | |
|---|---|---|---|---|
| 5,970,010 | A * | 10/1999 | Hira et al. ................... | 365/226 |
| 6,026,035 | A | 2/2000 | Kim | |
| 6,141,275 | A | 10/2000 | Tsai et al. | |
| 6,552,942 | B2 | 4/2003 | Kim et al. | |
| 6,909,646 | B2 * | 6/2005 | Hasegawa et al. ........... | 365/200 |
| 2001/0028581 | A1 * | 10/2001 | Yanagisawa et al. ... | 365/189.05 |
| 2001/0050873 | A1 * | 12/2001 | Tanaka et al. ............... | 365/205 |
| 2002/0048182 | A1 * | 4/2002 | Ooishi ......................... | 365/63 |
| 2003/0031066 | A1 * | 2/2003 | Yanagisawa et al. ........ | 365/200 |
| 2004/0017705 | A1 * | 1/2004 | Hasegawa et al. ........... | 365/200 |

FOREIGN PATENT DOCUMENTS

| | | |
|---|---|---|
| JP | 07-045076 | 2/1995 |
| JP | 7-450776 | 2/1995 |
| JP | 11-007770 A | 1/1999 |
| JP | 11-273350 | 10/1999 |
| KR | 1999-0086099 | 12/1999 |
| KR | 2001-0028260 | 4/2001 |
| KR | 10-2005-0027348 | 3/2005 |

* cited by examiner

*Primary Examiner*—Thong Q Le
(74) *Attorney, Agent, or Firm*—Blakely, Sokoloff, Taylor & Zafman

(57) ABSTRACT

A semiconductor memory device includes a bank, a data transfer line, a precharge control circuit, and a precharge line. The bank includes a multiplicity of cell mats arranged in a matrix form. Each of the cell mats has a plurality of unit cells. The data transfer line arranged between the cell mats transfers a data signal outputted from a selected cell mat among the cell mats. The precharge control circuit disposed on the edge of the bank controls the precharge of the data transfer line. The precharge line arranged between first and second cell mats transfers a precharge voltage to the precharge control circuit. The first and the second cell mats are disposed in the center of the bank.

9 Claims, 6 Drawing Sheets

SEMICONDUCTOR MEMORY DEVICE

CROSS-REFERENCE TO RELATED APPLICATION

The present invention claims priority of Korean patent application number 10-2006-0096355, filed on Sep. 29, 2006, which is incorporated by reference in its entirety.

BACKGROUND OF THE INVENTION

The present invention relates to a semiconductor memory device; and, more particularly, to a data transfer path for use in the semiconductor memory device.

As well-known in the art, a semiconductor memory device is a semiconductor device for storing a lot of data and providing desired data out of the stored data. In the main operation of the semiconductor memory device, there are a write operation for storing data and a read operation for outputting selected data from the stored data. Further, there is a precharge operation for getting read and write operations ready when those operations are not done. In addition, the semiconductor memory device which employs a capacitor in the unit of data storage like DRAM also performs a refresh operation for compensating for a natural leakage of a signal stored in the capacitor.

The semiconductor memory device is made in a manner that unit cells as a basic component for data storage are arranged in a matrix form to efficiently store numerous data. Each of the unit cells arranged in the matrix form is disposed at a point where a plurality of word lines crossing in a horizontal direction intersects a plurality of bit lines crossing in a longitudinal direction. Each of the word lines corresponds to a row address, while each of the bit lines corresponds to a column address. In general, in case of performing the read or write operation, a row address is first inputted and a corresponding one is selected from the plurality of word lines. Then, a column address is inputted and a corresponding one is selected from the plurality of bit lines. The data of unit cell designated by the selected word line and bit line indicates data to be accessed.

For efficient structure, the semiconductor device receives both a row address and a column address through one address input pad, and shares a pad where data is inputted/outputted. During the read operation, data is outputted through an input/output pad, and during the write operation, data is inputted through the input/output pad. And one data transfer path is established between the unit cell and the input/output pad. In the data transfer path, a transfer circuit for the write operation and a transfer circuit for the read operation are provided for transferring data in predetermined directions during those two operations. Each transfer circuit includes a sense amplifier for sensing and amplifying a data transfer line and a data signal transferred to the data transfer line.

In the semiconductor memory device, the unit cell is manufactured to store and maintain a minimum data signal for more data storage. Therefore, when there is a need to output a data signal stored in the unit cell, it is first required to sense and amplify the data signal in the unit cell.

There exists a large difference between a magnitude of a data signal outputted through the data input/output pad and that of a data signal stored in the unit cell. Further, a parasitic resistance of the data transfer line connected between the unit cell and the input/output pad is very large compared with the data signal stored in the unit cell. Accordingly, the semiconductor memory device amplifies a data signal stored in the unit cell in stages and then outputs it to the data pad to effectively access the data during the read operation.

In order to amplify the data signal in stages, the conventional semiconductor memory device is provided with two sense amplifiers, wherein a data transfer line is coupled between these two sense amplifiers. The first sense amplifier senses and amplifies a data signal when it is applied from a unit cell to a bit line, and then provides it to a local line which is a first data transfer line. The second sense amplifier senses and amplifies a data signal applied to a local line, and then delivers it to a global line which is a second data transfer line. The data output circuit accepts the data signal transferred to the global line and delivers the same to the data input/output pad. During the write operation, the data signal received through the input/output pad is stored in the unit cell via the global line and the local line and two sense amplifiers.

While no data is transferred to the global line and the local line, each is set to a precharge voltage. In general, one pair of local lines conveys one data signal differentially, and therefore, a total of three lines, one pair of local lines and a precharge line for carrying the precharge voltage, are disposed in an area where the local lines are provided.

The semiconductor memory device is provided with a plurality of banks, each of which has a multiplicity of unit cells, and a decoder capable of decoding the unit cells. As the degree of integration of the semiconductor memory device is improved, the number of unit cells prepared in one bank is gradually increased. Thus, the data lines for access of data stored in one bank become increasingly complicated.

The plurality of unit cells prepared in one bank is grouped by a plurality of cell mats, respectively. A data line for carrying data stored in the unit cell of each cell mat is arranged in each hall region formed between the cell mats. The data line arranged in the hall region includes one pair of local lines and the precharge line for precharge of the local lines.

Since all of these three lines are arranged between the cell mats provided in the bank, a circuit area occupied by these three data lines is quite large out of the whole circuit area of the bank.

For integration of the semiconductor memory device, it is necessary to reduce the circuit area of the bank, but there is a difficulty in doing so due to the data lines disposed between the cell mats.

SUMMARY OF THE INVENTION

Embodiments of the present invention are directed to provide a semiconductor memory device whose integration is improved by effectively arranging data lines.

In accordance with an aspect of the present invention, there is provided a semiconductor memory device including a bank, a data transfer line, and a precharge control circuit. The bank is provided with a multiplicity of cell mats. Each of the cell mats has a plurality of unit cells. The data transfer line arranged between the cell mats transfers a data signal outputted from a selected cell mat among the cell mats. The precharge control circuit disposed on the edge of the bank controls the precharge of the data transfer line.

In accordance with another aspect of the present invention, there is provided a semiconductor memory device including bank, a data transfer line, a precharge control circuit, and a precharge line. The bank includes a multiplicity of cell mats arranged in a matrix form. Each of the cell mats has a plurality of unit cells. The data transfer line arranged between the cell mats transfers a data signal outputted from a selected cell mat among the cell mats. The precharge control circuit disposed on the edge of the bank controls the precharge of the data transfer line. The precharge line arranged between first and second cell mats transfers a precharge voltage to the precharge control circuit. The first and the second cell mats are disposed in the center of the bank.

In accordance with another aspect of the present invention, there is provided a semiconductor memory device including a bank, a data transfer line, a precharge control circuit, and first and second precharge lines. The bank includes a multiplicity of cell mats arranged in a matrix form. Each of the cell mats has a plurality of unit cells. The data transfer line arranged between the cell mats transfers a data signal outputted from a selected cell mat among the cell mats. The precharge control circuit disposed on the edge of the bank controls the precharge of the data transfer line. The first precharge line arranged on the side of a first cell mat transfers a precharge voltage to the precharge control circuit. The first cell mat is disposed in an outermost region of the bank. The second precharge line arranged on the side of a second cell mat transfers a precharge voltage to the precharge control circuit. The second cell mat is disposed in another outermost region of the bank.

DESCRIPTION OF SPECIFIC EMBODIMENTS

Hereinafter, preferred embodiments of the present invention will be set forth in detail with reference to the accompanying drawings to a degree so that a person skilled in the art can easily carry out the invention.

Figure 1:
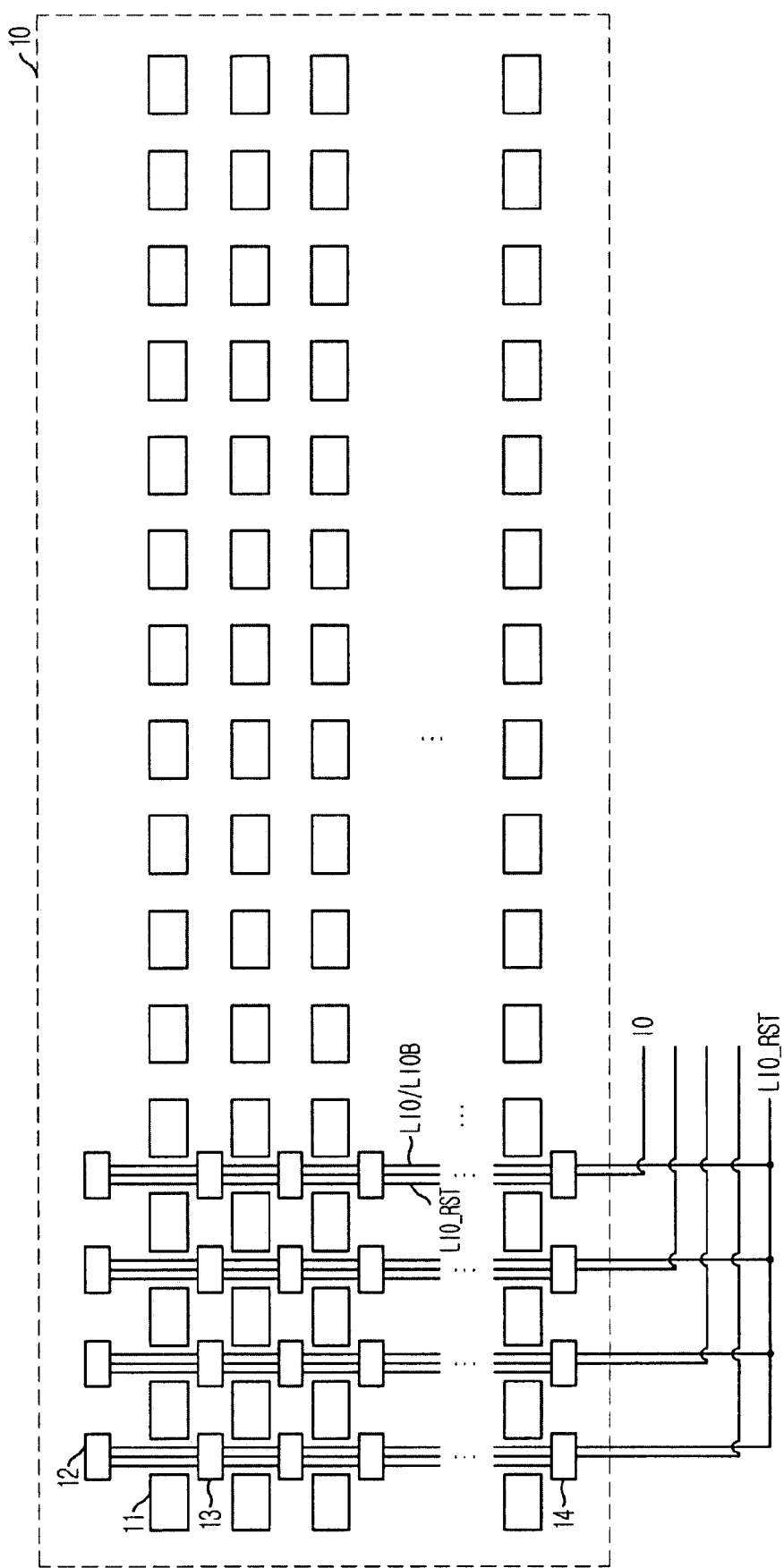
FIG. 1 shows a block diagram of a semiconductor memory device.

FIG. 1 shows a block diagram of a semiconductor memory device, especially of one bank 10 provided in the semiconductor memory device.

As shown in FIG. 1, a plurality of cell mats (e.g., 11) is arranged in one bank. And disposed in a hall region between the cell mats are one pair of local data lines LIO/LIOB for transferring a data signal of each unit cell in each cell mat and a precharge line LIO_RST for providing a precharge voltage of the local data lines LIO/LIOB. Further, a precharge control circuit 12 is provided on one side of the bank for providing a precharge voltage to the precharge line LIO_RST. In addition, a repeater circuit 13 is disposed between the local data lines LIO/LIOB for compensating for a loss of a data signal by a parasitic resistance of the local data lines LIO/LIOB. Also, a sense amplifier 14 is prepared in the bank for sensing and amplifying the data signal delivered via the local data lines LIO/LIOB, and then transferring it to a global data line IO.

Figure 2:
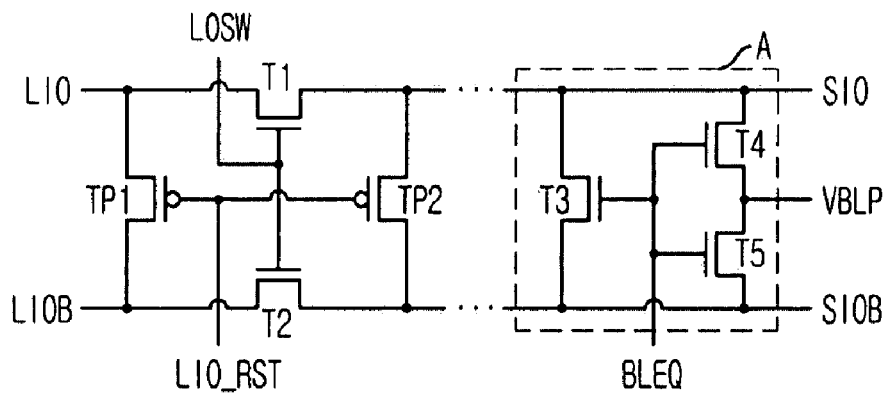
FIG. 2 provides a circuit diagram showing a data transfer path of the conventional semiconductor memory device.

FIG. 2 provides a circuit diagram showing a data transfer path of the conventional semiconductor memory device. In particular, FIG. 2 describes more details of the data line in the hall region of the bank 10 shown in FIG. 1.

The local data lines LIO/LIOB are connected to other local data lines SIO/SIOB. The other local data lines SIO/SIOB are data lines which are arranged in the cell mat region and convey a data signal of the unit cell to the local data lines LIO/LIOB. A precharge circuit A is for providing a precharge voltage VBLP to each of the local data lines SIO/SIOB in response to a control signal BLEQ. A MOS transistor TP2 is to maintain the same voltage level as that of the local data lines SIO/SIOB in response to a precharge signal LIO_RST. A MOS transistor TP1 is to maintain the same voltage level as that of the local data lines LIO/LIOB in response to the precharge signal LIO_RST. And, MOS transistors T1 and T2 are for connecting the local data lines LIO/LIOB and SIO/SIOB in response to a connection control signal LOSW, respectively.

Figure 3:
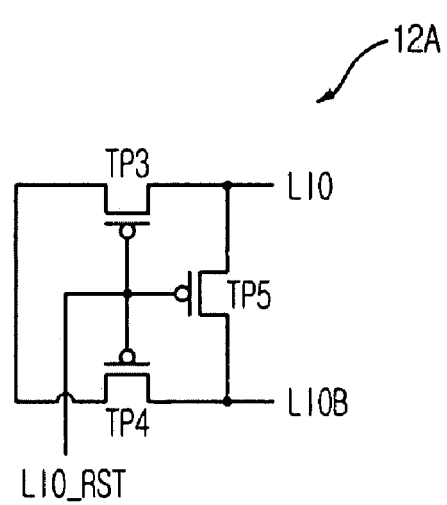
FIG. 3 presents a circuit diagram of a part of the precharge circuit of the conventional semiconductor memory device shown in FIG. 1.

FIG. 3 presents a circuit diagram of a part of the precharge control circuit of the semiconductor memory device shown in FIG. 1.

As shown therein, the precharge control circuit 12 is provided with MOS transistors TP3 and TP4 for providing a core voltage VCORE as the precharge voltage of the local data lines LIO/LIOB, and a MOS transistor TP5 for maintaining the same voltage level as that of the local data lines LIO/LIOB.

Figure 4:
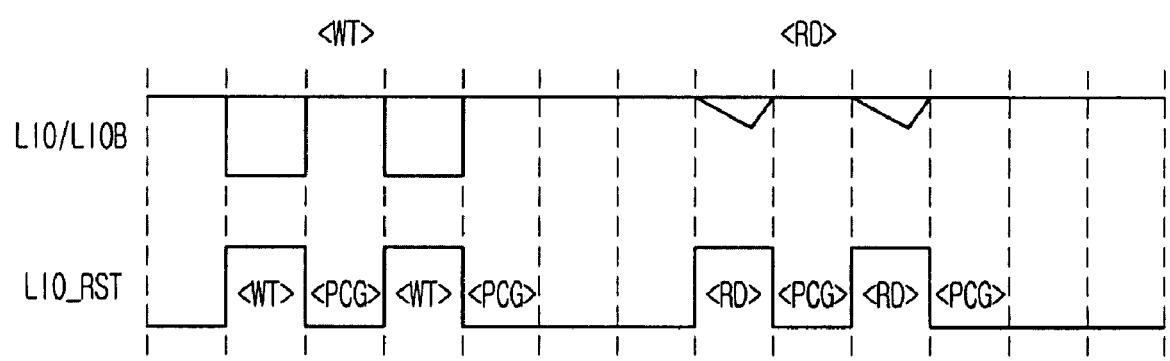
FIG. 4 is a waveform diagram describing the operation of the conventional semiconductor memory device shown in FIG. 1.

FIG. 4 is a waveform diagram describing the operation of the semiconductor memory device shown in FIG. 1. In the write operation WT where data is inputted from outside and stored in the unit cell, the local data lines LIO/LIOB are pulled-up or pulled-down by the inputted data signal. On the other hand, in the read operation RD where data is outputted from the unit cell to the outside, the local data lines LIO/LIOB are not fully pulled-up or pulled-down by the outputted data signal. This is because although the data signal from the outside has a sufficiently large driving capability, the data signal, which is sensed and amplified after it is stored in the unit cell, does not have a sufficiently large driving capability. While the data signal is transferred through the local data lines LIO/LIOB according to the read or write command, the precharge signal LIO_RST is at a high level which becomes a disable state. While the data signal is not transferred through the local data lines LIO/LIOB, it is at a low level which is kept in an activation state, thereby maintaining the same voltage level as that of the local data lines LIO/LIOB.

Figure 5:
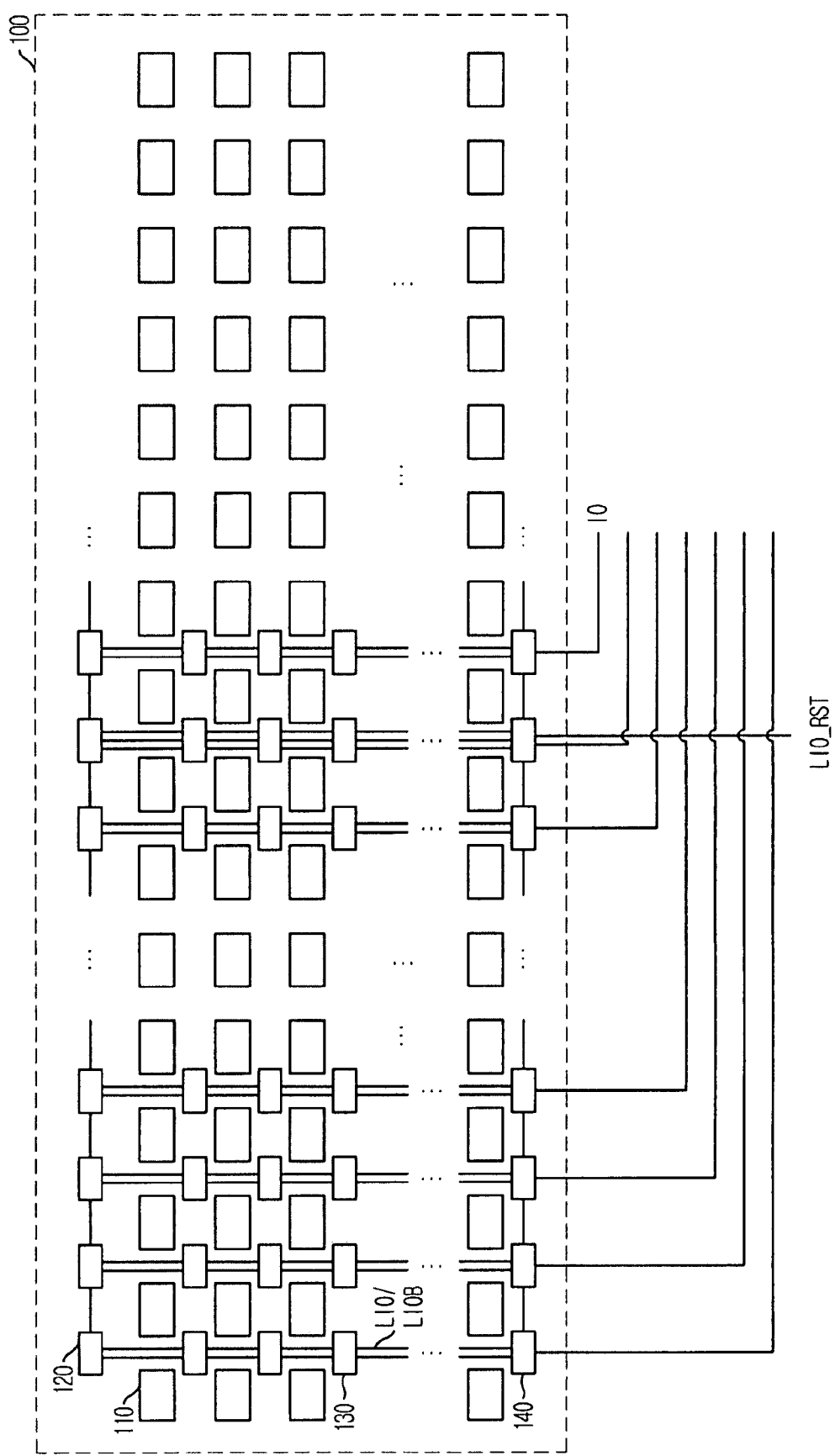
FIG. 5 illustrates a circuit diagram of a semiconductor memory device in accordance with a preferred embodiment of the present invention.

FIG. 5 illustrates a block diagram of a semiconductor memory device in accordance with a preferred embodiment of the present invention, especially of a bank of the semiconductor memory device.

As shown in FIG. 5, the bank of the semiconductor memory device of the present invention is provided with a plurality of cell mats (e.g., 110). And one pair of local data lines LIO/LIOB is disposed in a hall region between the cell mats for transferring a data signal of each unit cell in each cell mat. The bank of the semiconductor memory device of the present invention is characterized in that a precharge line LIO_RST for providing a precharge voltage of the local data lines LIO/LIOB to the hall region is not disposed and only local data lines LIO/LIOB are arranged. Further, with respect to the precharge line providing the precharge voltage, only one line is arranged in the center region of the bank. Also, a precharge control circuit 120 is prepared on one side of the bank for providing the precharge voltage to the precharge line LIO_RST. In addition, a repeater circuit 130 is disposed between the local lines LIO/LIOB for compensating for a loss of a data signal by a parasitic resistance of those local data lines LIO/LIOB. Besides, a sense amplifier 140 is prepared in the bank for sensing and amplifying a data signal delivered via the local data lines LIO/LIOB, and then transferring it to a global data line IO.

Figure 6:
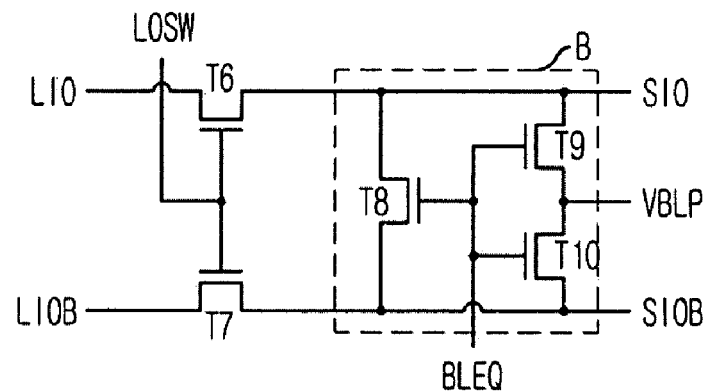
FIG. 6 offers a circuit diagram showing a data transfer path of the semiconductor memory device depicted in FIG. 5.

FIG. 6 offers a circuit diagram showing a data transfer path of the semiconductor memory device depicted in FIG. 5. Especially, FIG. 6 describes more details of the data line in the hall region of the bank 100 shown in FIG. 5.

As shown in FIG. 6, the local data lines LIO/LIOB are connected to other local data lines SIO/SIOB. The other local data lines SIO/SIOB are data lines which are arranged in the cell mat and convey a data signal of the unit cell to the local data lines LIO/LIOB. A precharge circuit B is for providing a precharge voltage VBLP to each of the local data lines SIO/SIOB in response to a control signal BLEQ. And, MOS transistors T6 and T7 are for connecting the local data lines LIO/LIOB and SIO/SIOB in response to a connection control signal LOSW, respectively. The present invention is characterized in that the MOS transistors TP1 and TP2 shown in FIG. 2 are not provided in the data transfer path of the semiconductor memory device.

Figure 7:
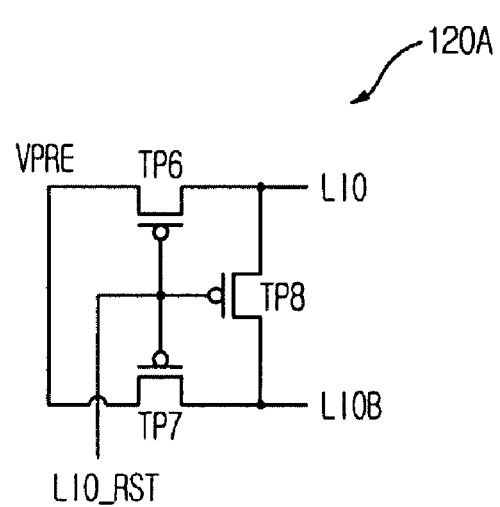
FIG. 7 illustrates a circuit diagram of a part of the precharge control circuit of the semiconductor memory device depicted in FIG. 5.

FIG. 7 illustrates a circuit diagram of a part of the precharge control circuit of the semiconductor memory device shown in FIG. 5.

As shown therein, the precharge control circuit 120 is provided with MOS transistors TP6 and TP7 for providing a precharge voltage VRE as the precharge voltage of the local data lines LIO/LIOB, and a MOS transistor TP8 for maintaining the same voltage level as that of the local data lines LIO/LIOB.

As the semiconductor memory device becomes highly-integrated, the number of data transfer lines arranged in one bank is gradually increased. If the precharge lines for precharge of the data transfer line are disposed together with the data transfer lines, a circuit area occupied by lines in the bank becomes relatively too great. If a lot of precharge lines are disposed, this has worse effects on IDD1, IDD4W&R, and IDD7 by the JDEC spec. The semiconductor memory device of the present invention is equipped with minimum precharge lines to minimize current consumption by IDD1, IDD4W&R, and IDD7, thereby improving the reliability of operation.

In the semiconductor memory device as shown in FIG. 1 the precharge lines were arranged for every hall of the bank. However, the semiconductor memory device of the present invention is implemented in such a way that the precharge lines are not arranged for every hall of the bank, so that the circuit area can be reduced and the amount of current consumption can also be decreased by the reduced precharge lines.

In particular, as shown in FIG. 6, the precharge line is not disposed in the hall region of the bank and the MOS transistors (see TP1 and TP2 of FIG. 2) for precharge of local lines are not also disposed, thereby giving rise to reduction in parasitic capacitance of the local lines. The precharge operation of the local lines is controlled by the precharge control circuit 120 and the sense amplifier 140 which are disposed on both sides of the bank.

The amount of current reduced by the semiconductor memory device in accordance with the present invention is calculated as follows. For example, the semiconductor memory device includes DDR1, DDR2, DDR3, etc.

Assuming that the precharge line of 3,000 μm was routed at 0.5 space intervals every hall, its pure capacitance becomes about 650 fF. By the conservation law of electrical charge known as "Q=CV=IT", it is rewritten as follows: I=CV/T. Here, C is 650 fF, V is an external or internal power supply voltage (VDD) for driving a precharge line, and T indicates a time when the fastest read or write operation is done at a maximum speed. For comparison at a same time, it is illustrated that DDR400 is applied to DDR1, DDR800 is applied to DDR2, and DDR1600 is applied to DDR3. In this case, a column operation time is computed as follows: tCK=5 ns.

In the DDR1, 2-bit prefetch operation is divided into operation for even data and operation for odd data, and thus, the operation is done internally every tCK=5 ns. In the DDR2, since 4-bit prefetch operation is performed, operation for first to fourth data is divided and done internally for every 2*tCK. And, in the DDR3, since 8-bit prefetch operation is performed, operation for first to eighth data is divided and burst operation is done internally for every 4*tCK. In these three types of memory devices, it can be seen that column operation, that is, write or read operation is done as follows: DDR1 tCK=DDR2 2*tCK=DDR3 4*tCK=5 ns. At this time, if the bank is configured as shown in FIG. 1, the amount of current flowing on the precharge line is calculated as follows:

$$DDR1(DDR400) I = C*V/T = 650 \text{ f}*2.8 \text{ v(high } VDD)/5 \text{ ns} = \text{about } 364 \text{ A}$$

$$DDR2(DDR800) I = C*V/T = 650 \text{ f}*2.1 \text{ v(high } VDD)/5 \text{ ns} = \text{about } 273 \text{ A}$$

$$DDR3(DDR1600) I = C*V/T = 650 \text{ f}*1.7 \text{ v(high } VDD)/5 \text{ ns} = \text{about } 221 \text{ A} \qquad \text{Eq. (1)}$$

If the bank is configured as shown in FIG. 5 according to the present invention, the amount of current flowing on the precharge line is calculated as follows:

$$DDR1(DDR400) I = C*V/T = 650 \text{ f}*2.8 \text{ v(high } VDD)/5 \text{ ns} = \text{about } 11.2 \text{ mA}$$

$$DDR2(DDR800) I = C*V/T = 650 \text{ f}*2.1 \text{ v(high } VDD)/5 \text{ ns} = \text{about } 8.5 \text{ mA}$$

$$DDR3(DDR1600) I = C*V/T = 650 \text{ f}*1.7 \text{ v(high } VDD)/5 \text{ ns} = \text{about } 7 \text{ mA} \qquad \text{Eq. (2)}$$

This current reduction is because the number of precharge lines used in the bank shown in FIG. 5 is remarkably decreased compared with that shown in FIG. 1.

Figure 8:
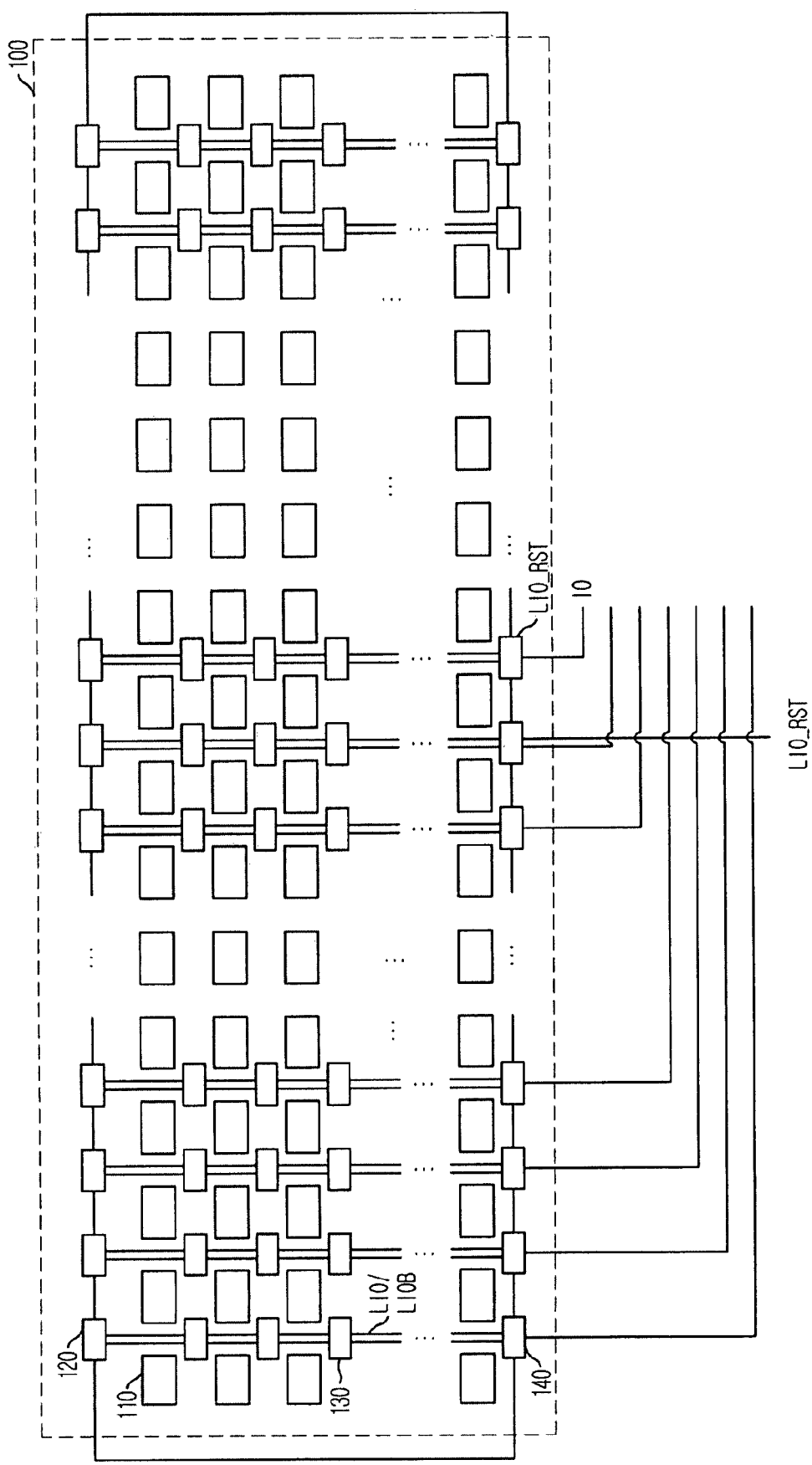
FIG. 8 illustrates a block diagram of a semiconductor memory device in accordance with another preferred embodiment of the present invention.

FIG. 8 illustrates a circuit diagram of a semiconductor memory device in accordance with another preferred embodiment of the present invention, especially centering around a bank.

The bank of the semiconductor memory device in accordance with another preferred embodiment of the invention shown in FIG. 8 is similar to that shown in FIG. 5, but is characterized in that the precharge line transferring the precharge signal LIO_RST is arranged on the edge of the bank. In this manner, minimum precharge lines can be disposed in the bank in various types, rather than disposing the precharge line every hall region.

As a result, the present invention can greatly reduce the number of precharge lines, thus remarkably reducing the amount of current during the operation of the semiconductor memory device. Accordingly, the reliability of the semiconductor memory device can be improved considerably.

While the present invention has been described with respect to the specific embodiments, it will be apparent to those skilled in the art that various changes and modifications may be made without departing from the spirit and scope of the invention as defined in the following claims.

What is claimed is:

1. A semiconductor memory device comprising:
   a bank including a multiplicity of cell mats, each having a plurality of unit cells;
   a data transfer line arranged between each of the cell mats for transferring a data signal outputted from a selected cell mat among the cell mats;
   a precharge control circuit disposed on one side of the bank for controlling the precharge of the data transfer line; and
   a sense amplifier disposed on another side of the bank which is opposite to the precharge control circuit for sensing and amplifying a data signal provided through the data transfer line.

2. The semiconductor memory device as recited in claim 1, wherein the data transfer line is provided with a pair of first and second data lines.

3. The semiconductor memory device as recited in claim 2, wherein the precharge control circuit includes:
   a first switching circuit for transferring a precharge voltage to the data transfer line; and
   a second switching circuit for equalizing the first and the second data lines.

4. A semiconductor memory device comprising:
   a bank including a multiplicity of cell mats arranged in a matrix form, each having a plurality of unit cells;
   a data transfer line arranged between each of the cell mats for transferring a data signal outputted from a selected cell mat among the cell mats;
   a precharge control circuit disposed on one side of the bank for controlling the precharge of the data transfer line;
   a precharge line arranged between first and second cell mats which are disposed in the center of the bank for transferring a precharge voltage to the precharge control circuit; and
   a sense amplifier disposed on another side of the bank which is opposite to the precharge control circuit for sensing and amplifying a data signal provided through the data transfer line.

5. The semiconductor memory device as recited in claim 4, wherein the data transfer line is provided with a pair of first and second data lines.

6. The semiconductor memory device as recited in claim 5, wherein the precharge control circuit includes:
   a first switching circuit for transferring a precharge voltage to the data transfer line; and
   a second switching circuit for equalizing the first and the second data lines.

7. A semiconductor memory device comprising:
   a bank including a multiplicity of cell mats arranged in a matrix form, each having a plurality of unit cells;
   a data transfer line arranged between each of the cell mats for transferring a data signal outputted from a selected cell mat among the cell mats;
   a precharge control circuit disposed on one side of the bank for controlling the precharge of the data transfer line;
   a first precharge line arranged on a side of a first cell mat which is disposed in an outermost region of the bank for transferring a precharge voltage to the precharge control circuit;
   a second precharge line arranged on a side of a second cell mat which is disposed in another outermost region of the bank for transferring a precharge voltage to the precharge control circuit; and
   a sense amplifier disposed on another side of the bank which is opposite to the precharge control circuit for sensing and amplifying a data signal provided through the data transfer line.

8. The semiconductor memory device as recited in claim 7, wherein the data transfer line is provided with a pair of first and second data lines.

9. The semiconductor memory device as recited in claim 8, wherein the precharge control circuit includes:
   a first switching circuit for transferring a precharge voltage to the data transfer line; and
   a second switching circuit for equalizing the first and the second data lines.

* * * * *